United States Patent
Chen et al.

(10) Patent No.: US 11,576,277 B2
(45) Date of Patent: Feb. 7, 2023

(54) RACK FOR SUPPORTING SERVERS OF VARYING HEIGHTS

(71) Applicant: QUANTA COMPUTER INC., Taoyuan (TW)

(72) Inventors: Chao-Jung Chen, Taoyuan (TW); Chih-Ming Chen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 318 days.

(21) Appl. No.: 16/847,226

(22) Filed: Apr. 13, 2020

(65) Prior Publication Data
US 2021/0259129 A1  Aug. 19, 2021

Related U.S. Application Data

(60) Provisional application No. 62/976,833, filed on Feb. 14, 2020.

(51) Int. Cl.
  *H05K 7/18*   (2006.01)
  *H05K 7/14*   (2006.01)

(52) U.S. Cl.
  CPC .......... *H05K 7/183* (2013.01); *H05K 7/1489* (2013.01)

(58) Field of Classification Search
  CPC ....... H05K 7/183; H05K 7/1489; A47B 57/50
  See application file for complete search history.

(56) References Cited

U.S. PATENT DOCUMENTS

| 2,354,269 A | * | 7/1944 | Marchand | A47B 57/50 248/243 |
| 5,168,431 A | * | 12/1992 | Moulton | H05K 7/1425 361/784 |
| 5,202,818 A | * | 4/1993 | Betsch | H02B 1/301 361/829 |

(Continued)

FOREIGN PATENT DOCUMENTS

| DE | 9301050 U1 | * | 5/1993 |
| DE | 9212031 U1 | * | 2/1994 |

(Continued)

*Primary Examiner* — Stanton L Krycinski
(74) *Attorney, Agent, or Firm* — Nixon Peabody LLP (57) ABSTRACT

A server rack for supporting a plurality of servers of varying heights includes opposing side walls each including one or more vertical tracks. A first column of holes is disposed in one of the vertical tracks and a second column of holes disposed in a corresponding opposing vertical track of the opposing side wall. A third and fourth column of holes are disposed adjacent to and corresponding to the first column of holes and the second column of holes. A first pair of opposing rails are each disposed on the opposing side walls. Each of the opposing rails are mechanically secured to the one or more vertical tracks at the first and second columns of holes. The first pair of opposing rails are configured to support a first server having a first height. For the first and second columns of holes, the spacing between holes is predefined to accommodate opposing rails to support servers of the first height. For the third and fourth columns of holes, the spacing between holes is predefined to accommodate rails to support servers of a second different height and a different size than the first server.

20 Claims, 7 Drawing Sheets

(56) References Cited

U.S. PATENT DOCUMENTS

| | | | | |
|---|---|---|---|---|
| 5,372,262 | A * | 12/1994 | Benson | A47B 47/02 312/265.4 |
| 5,574,251 | A * | 11/1996 | Sevier | H05K 7/183 174/50 |
| 5,761,797 | A * | 6/1998 | Besserer | H02B 1/01 361/752 |
| 5,791,498 | A * | 8/1998 | Mills | H02B 1/34 211/183 |
| 5,845,795 | A * | 12/1998 | Mulholland | A47B 47/027 248/221.12 |
| 6,006,925 | A * | 12/1999 | Sevier | H05K 7/183 361/829 |
| 6,021,909 | A * | 2/2000 | Tang | H05K 7/1421 211/183 |
| 6,036,290 | A * | 3/2000 | Jancsek | H02B 1/301 312/265.3 |
| 6,095,345 | A * | 8/2000 | Gibbons | H05K 7/1489 361/829 |
| 6,173,848 | B1 * | 1/2001 | Bravo | H05K 7/1425 211/187 |
| 6,513,770 | B1 * | 2/2003 | Franz | G02B 6/4471 312/223.1 |
| 6,588,866 | B2 * | 7/2003 | Cheng | H05K 7/1489 |
| 6,927,974 | B2 * | 8/2005 | Robillard | H05K 7/1492 439/246 |
| 7,293,666 | B2 * | 11/2007 | Mattlin | F16B 7/044 312/257.1 |
| 7,425,678 | B2 * | 9/2008 | Adducci | E05C 9/048 174/53 |
| 7,472,970 | B2 * | 1/2009 | Bergesch | G06F 1/183 312/223.1 |
| 7,529,097 | B2 * | 5/2009 | Coglitore | G06F 1/183 211/26.2 |
| 7,975,860 | B2 * | 7/2011 | Dittus | H05K 7/1489 211/207 |
| 8,083,298 | B2 * | 12/2011 | Henderson | H05K 7/1489 312/334.4 |
| 8,235,225 | B2 * | 8/2012 | Ye | G11B 33/128 211/41.12 |
| 8,456,844 | B2 * | 6/2013 | Chou | H05K 7/1494 361/679.08 |
| 9,066,441 | B2 * | 6/2015 | Kilian | H05K 7/1498 |
| 9,232,678 | B2 * | 1/2016 | Bailey | H05K 7/1492 |
| 9,451,729 | B2 * | 9/2016 | Bailey | H05K 7/1491 |
| 9,456,520 | B1 * | 9/2016 | Wilson | H05K 7/183 |
| 9,814,156 | B2 * | 11/2017 | Wilson | H05K 7/183 |
| 9,854,690 | B1 * | 12/2017 | Frye | H05K 7/1489 |
| 9,943,003 | B2 * | 4/2018 | Segroves | H05K 5/0234 |
| 10,080,306 | B2 * | 9/2018 | Dennison | A47B 88/43 |
| 10,159,164 | B2 * | 12/2018 | Liao | A47B 88/43 |
| 10,182,651 | B2 * | 1/2019 | Jost | H05K 7/1488 |
| 10,201,110 | B1 * | 2/2019 | Huyett | H05K 7/1489 |
| 10,251,302 | B2 * | 4/2019 | Bachar | H05K 7/1488 |
| 10,264,698 | B2 * | 4/2019 | Kho | H05K 7/1492 |
| 10,314,394 | B2 * | 6/2019 | Chen | H05K 7/183 |
| 10,470,333 | B2 * | 11/2019 | Chen | H05K 7/1489 |
| 11,346,466 | B2 * | 5/2022 | Marcinkowski | H05K 7/183 |
| 2003/0034717 | A1 * | 2/2003 | Yao | G06F 1/183 312/334.4 |
| 2004/0201335 | A1 * | 10/2004 | Davis | G06F 1/181 312/265.3 |
| 2005/0039644 | A1 * | 2/2005 | Sheahan | F16B 12/30 108/152 |
| 2006/0283816 | A1 * | 12/2006 | Moore | A47B 57/48 211/26 |
| 2007/0175835 | A1 * | 8/2007 | Liang | H05K 7/1489 211/26 |
| 2011/0114575 | A1 * | 5/2011 | Peng | H02B 1/01 211/26 |
| 2011/0114576 | A1 * | 5/2011 | Hsiao | H05K 7/183 211/26 |
| 2014/0175033 | A1 * | 6/2014 | Chen | H05K 7/183 211/49.1 |
| 2019/0141852 | A1 * | 5/2019 | Anderson | H05K 7/1489 |
| 2021/0084789 | A1 * | 3/2021 | Kuo | H05K 7/1492 |
| 2021/0102643 | A1 * | 4/2021 | Marcinkowski | F16L 3/015 |

FOREIGN PATENT DOCUMENTS

| | | | | |
|---|---|---|---|---|
| DE | 102007059204 | A1 * | 6/2009 | H02B 1/30 |
| DE | 102018108230 | A1 * | 10/2019 | A47F 3/0426 |
| FR | 1278339 | A * | 12/1961 | |
| FR | 2130856 | A5 * | 11/1972 | |
| GB | 191111299 | A * | 9/1911 | |
| GB | 2184345 | A * | 6/1987 | H05K 7/183 |
| WO | WO-9414307 | A1 * | 6/1994 | H05K 7/183 |

* cited by examiner

RACK FOR SUPPORTING SERVERS OF VARYING HEIGHTS

CROSS-REFERENCE TO RELATED APPLICATION

This application claims priority under 35 U.S.C. § 119 to U.S. Provisional Application No. 62/976,833, entitled "MULTI-UNIT HIGH PITCH FOR SERVER RACK DESIGN", filed on Feb. 14, 2020. The contents of that application are hereby incorporated by reference in their entirety.

FIELD OF THE INVENTION

The present invention relates to a server rack for holding a plurality of servers. More specifically, the present invention relates to a server rack for supporting a plurality of servers of varying heights.

BACKGROUND

Rackmounted computing devices, such as rackmounted servers, are employed in large numbers for high demand applications such as network based systems or data centers. Server racks are used to store and organize server equipment. One type of server rack is referred to as a U space or Rack Unit ("RU"), where vertical hole spacing for one U space or RU is defined having a height of 1.75 inches. Another type of server rack is referred to as OpenU ("OU"), where vertical hole spacing is also defined having a height of 1.89 inches that is slightly taller than RU and allows for improved air flow and cable management in a rack. Server racks are fabricated to accommodate a single pitch or single height server only. The present disclosure is directed to server rack systems that increase efficiency in accommodating servers.

SUMMARY

According to one embodiment, a server rack for supporting a plurality of servers of varying heights comprises opposing side walls each including one or more vertical tracks. A first column of holes is disposed in one of the vertical tracks and a second column of holes is disposed in a corresponding opposing vertical track of the opposing side wall. A third column of holes is disposed adjacent to and corresponding to the first column of holes. A fourth column of holes is disposed adjacent to and corresponding to the second column of holes. A first pair of opposing rails are each disposed on the opposing side walls. Each of the opposing rails is mechanically secured to the one or more vertical tracks at the first and second columns of holes. The first pair of opposing rails is configured to support a first server of the plurality of servers. The first server has a first height. For the first and second columns of holes, the spacing between holes is predefined to accommodate opposing rails to support servers of the first height. For the third and fourth columns of holes, the spacing between holes is predefined to accommodate rails to support servers of a second height and a different size than the first server. The second height is different from the first height.

A further aspect of the embodiment includes the first pair of opposing rails being mechanically secured by one or more pins extending from each rail into one or more holes in the first and second columns of holes disposed in the vertical tracks. In another aspect, each of the opposing side walls has two separate side wall panels that have a gap therebetween. In another aspect, each of the two separate side wall panels includes a vertical track. Each vertical track includes additional columns of holes with hole spacings predefined to accommodate rails to support servers of the first height, and adjacent columns of holes with hole spacings predefined to accommodate rails to support servers of the second height.

In a further aspect of the embodiment, a second pair of opposing rails is disposed on each of the opposing side walls to support a second server of the plurality of servers. The second server has the second height and the different size than the first server. The second server is disposed immediately below the first server. Each of the second pair of opposing rails is mechanically secured to the third and fourth columns of holes such that the server rack supports both the first server and the second server. In another aspect, a third pair of opposing rails is disposed on each of the opposing side walls to support a third server of the plurality of servers having the first height. The third server is disposed immediately below the second server. Each of the third pair of opposing rails is mechanically secured to the first and second columns of holes such that the server rack supports the first server, the second server, and the third server.

In a further aspect of the embodiment, the one or more vertical tracks are fastened to a corresponding side wall or side wall panel. In another aspect, the one or more vertical tracks are integral with a corresponding side wall or side wall panel. In a further aspect, each of the one or more vertical tracks is parallel to one another. In yet a further aspect, the first and second columns of holes include slotted holes. In another aspect, the slotted holes include at least one keyhole. In yet another aspect, the third and fourth columns of holes includes slotted holes. In yet a further aspect, the slotted holes include at least one keyhole.

According to another embodiment, a method for securing a plurality of servers of varying heights in the same server rack comprises providing a server rack having opposing side walls. A first vertical track is provided that includes a first column of holes on a first of the opposing side walls. The spacing between holes in the first column of holes is predefined to accommodate rails to support servers having a first height. A second vertical track is provided that includes a second column of holes on a second of the opposing side walls that corresponds to the first column of holes. The spacing between holes in the second column of holes is predefined to accommodate rails to support servers of a first height. Third and fourth columns of holes are provided adjacent to each of the first and second columns of holes in the first vertical track and the second vertical track. The spacing between holes of the third and fourth columns of holes are predefined to accommodate rails to support servers having a second height. The second height is different from the first height. A first set of opposing rails is secured to the first and second vertical tracks at the corresponding first and second columns of holes. The first set of opposing rails is configured to support a first server of the plurality of servers.

A further aspect of the embodiment includes the first set of opposing rails being mechanically secured by one or more pins extending from the rail into one or more holes in the first and second columns of holes disposed in the vertical tracks. In another aspect, each of the opposing side walls includes two separate side wall panels having a gap therebetween. In a further aspect, each of the two separate side walls includes a vertical track. Each vertical track includes another first column of holes and another second column of holes adjacent to the corresponding another first column of holes. In yet another aspect, a second set of opposing rails is disposed on each of the opposing side walls to support a second server of the plurality of servers. The second server has the second height that is a different size from the first server. The second server is disposed immediately below the first server. Each of the second set of opposing rails is mechanically secured to the third and fourth columns of holes such that the server rack supports both the first server and the second server. In a further aspect, a third set of opposing rails is disposed on each of the opposing side walls to support a third server of the plurality of servers. The third server has the first height, and is disposed immediately below the second server. Each of the third set of opposing rails is mechanically secured to the first and second columns of holes such that the server rack supports the first server, the second server, and the third server. In yet another aspect, all the columns of holes disposed in the vertical tracks include slotted holes.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of embodiments together with reference to the accompanying drawings.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The various embodiments are described with reference to the attached figures, where like reference numerals are used throughout the figures to designate similar or equivalent elements. The figures are not drawn to scale, and they are provided merely to illustrate the instant invention. It should be understood that numerous specific details, relationships, and methods are set forth to provide a full understanding. One having ordinary skill in the relevant art, however, will readily recognize that the various embodiments can be practiced without one or more of the specific details, or with other methods. In other instances, well-known structures or operations are not shown in detail to avoid obscuring certain aspects of the various embodiments. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

With regards to the present disclosure, the terms "computing device" or "computing system" or "computer system" refer to any electronically-powered or battery-powered equipment that has hardware, software, and/or firmware components, where the software and/or firmware components can be configured for operating features on the device. The term "operating environment" can refer to any operating system or environment that functions to allow software to run on a computer system.

It would be desirable and advantageous to increase the efficiency in storing servers in server racks, for example, by increasing the server density in data centers without requiring greater physical data center space. Furthermore, it would be desirable to for different types of servers to be stored in the same server rack. The presently described technology provides a server rack with rails to support servers of different heights and sizes rather than only one type of server. The present technology is also desirable as server technology changes and more servers are developed of varying sizes, beyond for example, Rack Unit or OpenU type servers that must be placed in server racks supporting only one type of server. The present technology also allows for more flexibility and interchangeability of server racks.

The present technology provides for a server rack that includes support rails secured to vertical tracks on opposing side walls. The vertical tracks include columns of adjacent holes where one column has hole spacings for supporting a rail for one type of server having a first height. An immediately adjacent column of holes has different hole spacings for supporting a rail for another type of server having a second different height. It is further contemplated that the vertical tracks could include additional adjacent columns of holes where each adjacent column has yet further different hole spacings for supporting rails for yet further types of servers also having different heights.

Figure 1:
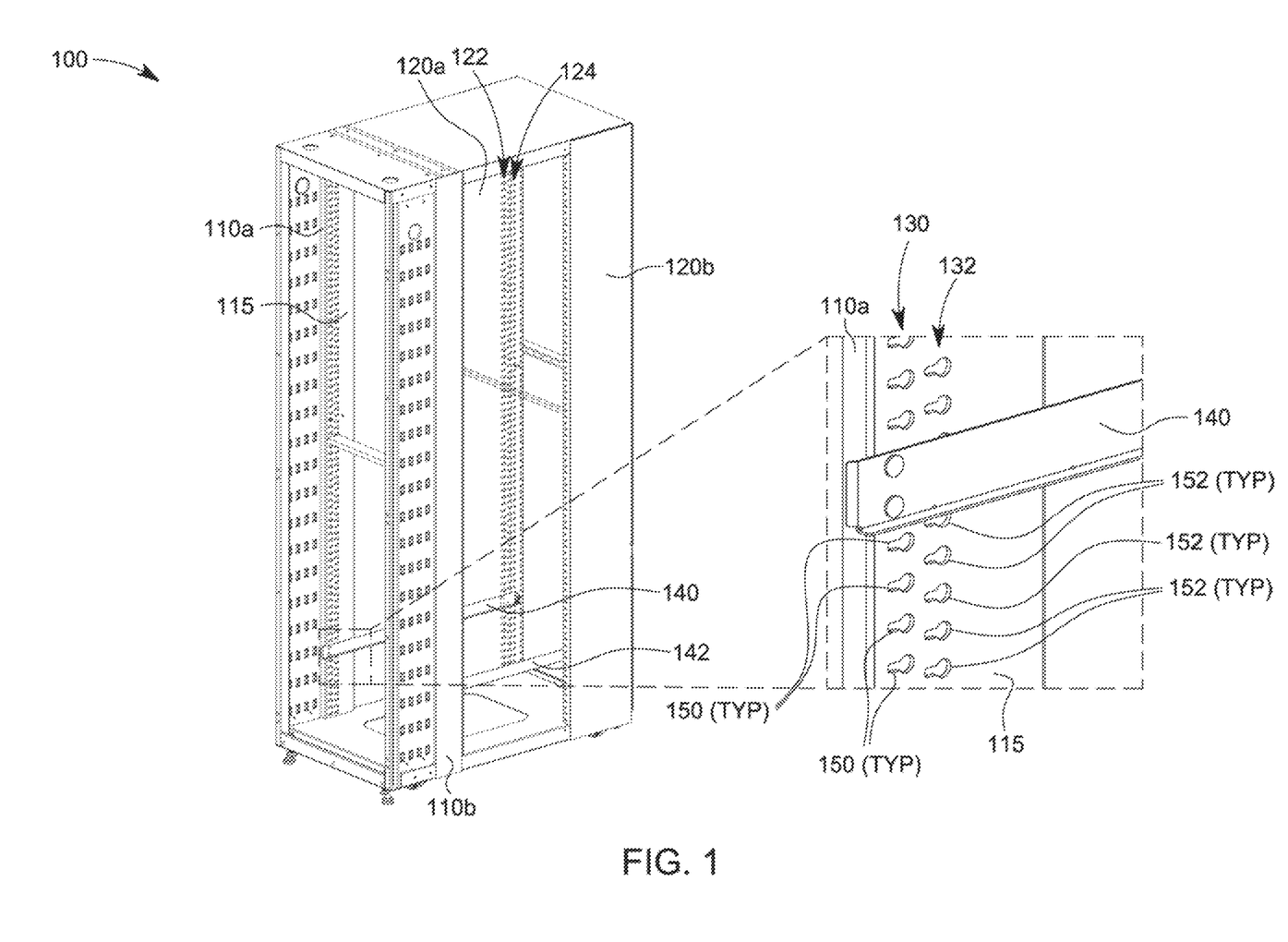
FIG. 1 is a perspective view of a server rack with multiple opposing side walls including two columns of receiving holes for securing different standardized rails to allow servers of varying height to be disposed in the server rack, according to some implementations of the present disclosure.

Turning now to FIG. 1, a perspective view of a server rack 100 is depicted with multiple opposing side walls, such as opposing side wall panels 110a, 110b and 120a, 120b. Each of the opposing side wall panels includes two or more columns of receiving holes, such as a first column of holes 130 and an adjacent second column of holes 132. The columns of receiving holes can be disposed on one or more vertical tracks, such as vertical track 115, that may be integral with the side wall or fastened thereto. The columns of receiving holes used to secure standardized rails, such as opposing rails 140, 142, to the one or more vertical tracks and/or the side wall panels to allow servers of varying heights to be disposed in the server rack 100.

In some implementations, the first column of holes, such as the column of holes 130, is disposed in a vertical track 115, and a second column of holes (not shown) is disposed in a corresponding opposing vertical track (not shown) of the opposing side wall, such as side wall 110b. A third column of holes, such as the column of holes 132, is disposed adjacent to and corresponding to the first column of holes, such as column of holes 130. A fourth column of holes (not shown) is disposed adjacent to and corresponding to the second column of holes in the corresponding opposing vertical track (not shown) of the opposing side wall, such as side wall 110b. A first pair of opposing rails, such as rails 140, 142, are each disposed on the opposing side walls, such as opposing side walls 110a, 110b and 120, 120b. Each of the opposing rails is mechanically secured to the one or more vertical tracks at the first and second columns of holes.

In the example of a first column of holes 130 and a second column of holes (not shown) 132 in FIG. 1, the two columns are disposed adjacent to each other. For the first and second columns of holes, the spacing between holes is predefined to accommodate opposing rails to support servers of the first height. The first and second columns of holes extend vertically for nearly the entire height of the side wall 110a. The holes can be circular and slotted. In the example of FIG. 1, the holes 150 are in the shape of a keyhole. It is further contemplated that the holes may be threaded such that the rails are fastened to the vertical track via screw hole(s) in the rail. In other aspects, each rail may have a pin extension with the portion of the pin farthest from the rail being flanged such that the pin extension fits into the circular portion of a slotted hole or keyhole. For example, a hole may also be shaped to include a slot having a slot width that is just bigger than the diameter of the pin, but a slot width smaller than the overall diameter of the flange at the end of the pin.

In some implementations, the first column of holes, and the corresponding column of holes on the opposing side wall, are vertically configured such that the spacing between holes is consistent with a rack unit or RU configuration. In an RU configuration, each RU is 1.75 inches. One type of full-size server rack is 42 U or just over 6 feet tall (e.g., approximately 42 units×1.75 inches) assuming the rack is configured to only hold RU-sized servers. The second column of holes and the corresponding column of holes on the opposing side wall are vertically configured where the spacing between holes is consistent with an Open Rack or OU configuration. In an OU configuration, each OU is 1.89 inches. One type of standard full-size server rack is 420 U and is just over 6.5 feet tall (e.g., approximately 42 units×1.89 inches) assuming the rack is configured to only hold OU-sized servers. While specific reference is made to RU and OU configurations, the present technology is for a server rack that can accommodate servers of other sizes and heights.

The spacing between holes 150 in the first column of holes 110a is predefined so that when the opposing rails 140, 142 are disposed in the holes at the opposing side walls, a server of a predefined size and height is supported on the rails. Similarly, the spacing between holes 152 in the second column of holes 132 is also predefined with a different spacing so that when opposing rails are disposed in the holes 152 at the opposing side walls, a second server of a different predefined size and height than the first server is supported on the rails.

In some aspects, yet another column of holes (not shown) can be disposed adjacent to the first and second columns of holes and have yet another different spacing between the holes. Then, when opposing rails are disposed in the holes at the opposing side walls, a different server having a different predefined size and height from the first and second servers can be supported by the rails.

A desirable aspect of the present technology is that servers of different sizes and different heights can all be installed in the same server rack because the opposing rails can be adjusted up or down on a column of rails. This allows the spacing between different sized servers and same sized servers to be arranged to maximize the number of servers placed into the server rack.

Figure 2:
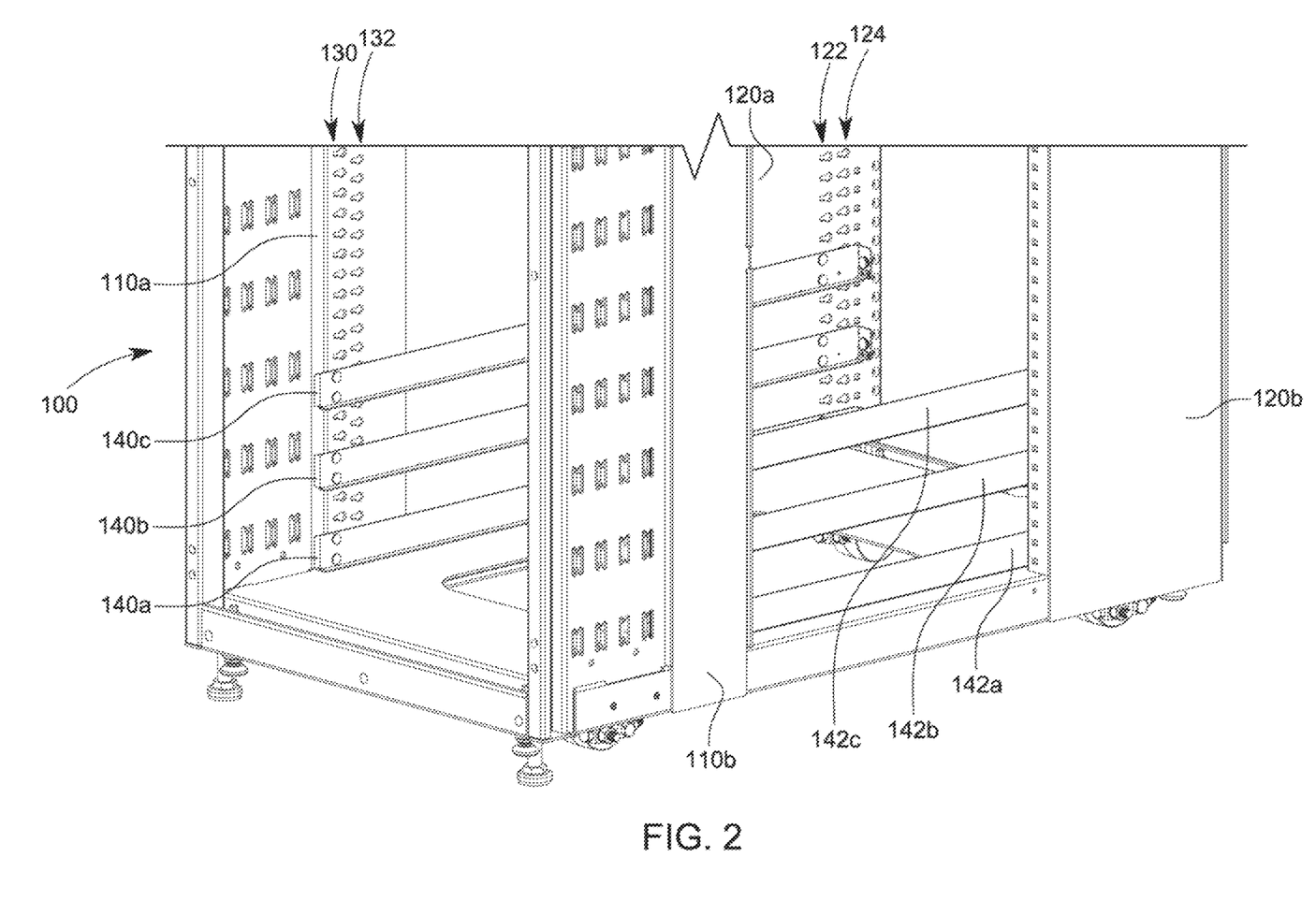
FIG. 2 is a perspective view of a bottom portion of the server rack in FIG. 1 configured for disposing servers of a uniform height in the server rack, according to some implementations of the present disclosure.

Turning now to FIG. 2, a perspective view of a bottom portion of the server rack 100 in FIG. 1 is depicted configured for holding servers of a uniform height in the server rack. The exemplary configuration of FIG. 2 is for OU type servers though configurations for other types of servers are contemplated. Furthermore, while more or fewer opposing rails are contemplated, the exemplary aspect of FIG. 2 includes three pairs of opposing rails labeled as 140a, 142a; 140b, 142b; and 140c, 142c. The three pairs of opposing rails are fastened, or otherwise mechanically secured, to side walls 10a, 10b, 120a, 120b. In some aspects, the side walls may extend for the entire depth of the server rack. In other aspects, as illustrated in FIGS. 1 and 2, the side walls are side wall panels with a gap between each side wall panel.

The opposing rails 140a, 140b, 140c may be fastened with screws or pin extensions to holes disposed in a vertical track, or in the side wall itself, in a first column of holes 130 and a second column of holes 122 at side wall panels 110a, 120a. Opposing rails 142a, 142b, 142c are also similarly fastened to corresponding holes (not shown) at side wall panels 110b, 120b. The opposing rails are evenly spaced based on the holes in the first and second columns of holes 130, 122 being evenly spaced to accommodate a sever of a predetermined size and height. As will be discussed later with respect to FIGS. 4 to 7, the same server rack 100 can also be configured to support servers having different sizes and heights by using the columns of holes 132, 124 adjacent to the first and second columns of holes 130, 122.

Figure 3:
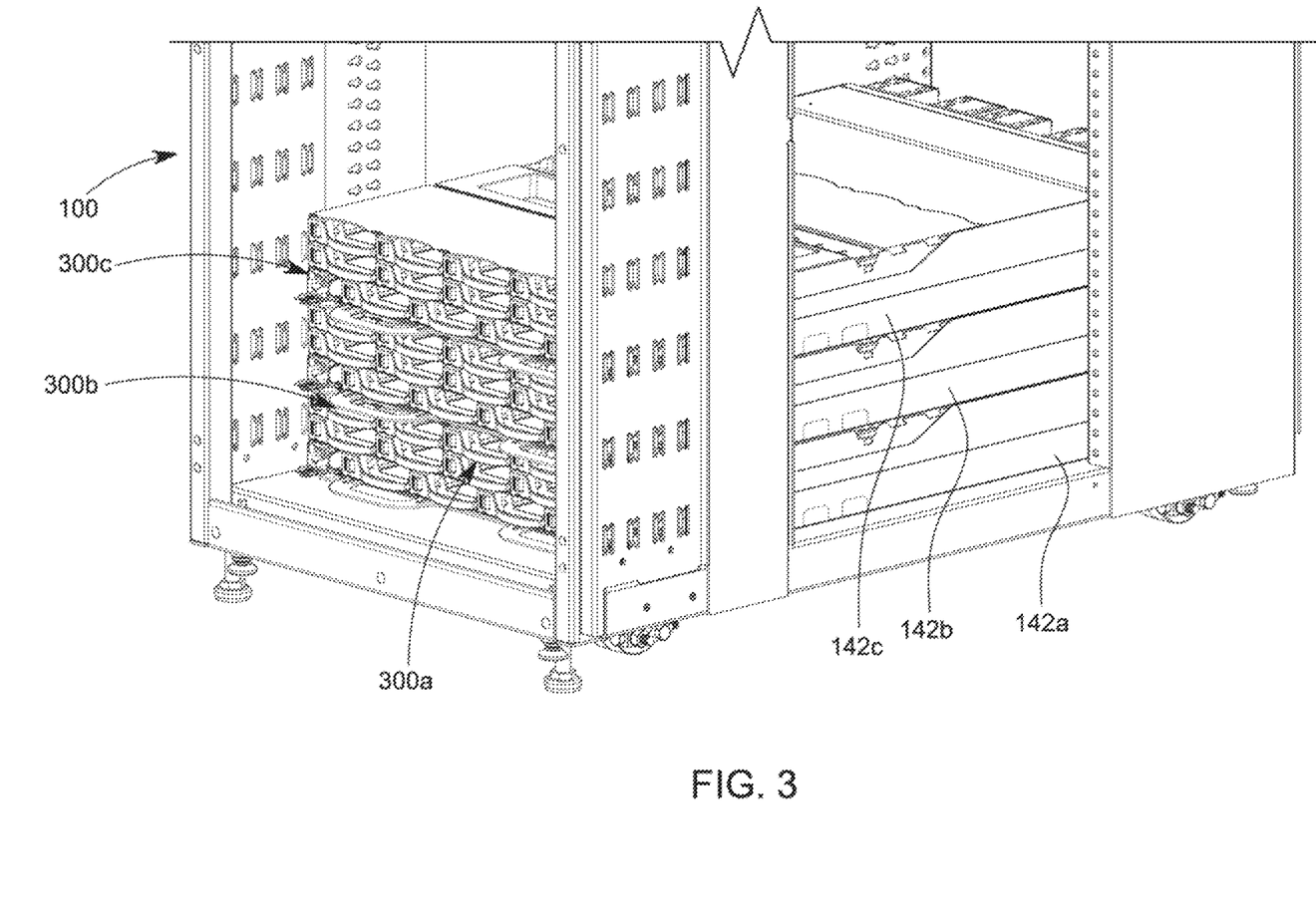
FIG. 3 is a perspective view of the bottom portion of the server rack in FIG. 2 with the servers of a uniform height disposed in the server rack, according to some implementations of the present disclosure.

Turning now to FIG. 3, a perspective view of the bottom portion of the server rack 100 in FIG. 2 is depicted with the servers 300a to 300c having a uniform height and disposed in the server rack 100. The first pair of opposing rails 140a, 142a support the first server 300a of the plurality of servers, where the plurality of servers in this exemplary aspect have a uniform height. Similarly, a second pair of opposing rails 140b, 142b support second server 300b of the plurality of servers. The rails are configured such that the second server 300*b* is disposed immediately above the first server 300*a*. In addition, a third pair of opposing rails 140*c*, 142*c* support third server 300*c* of the plurality of servers. The rails are configured such that the third server 300*c* is disposed immediately above the second server. Additional servers can be similarly added to the server rack 100 until the rack is full.

Figure 4:
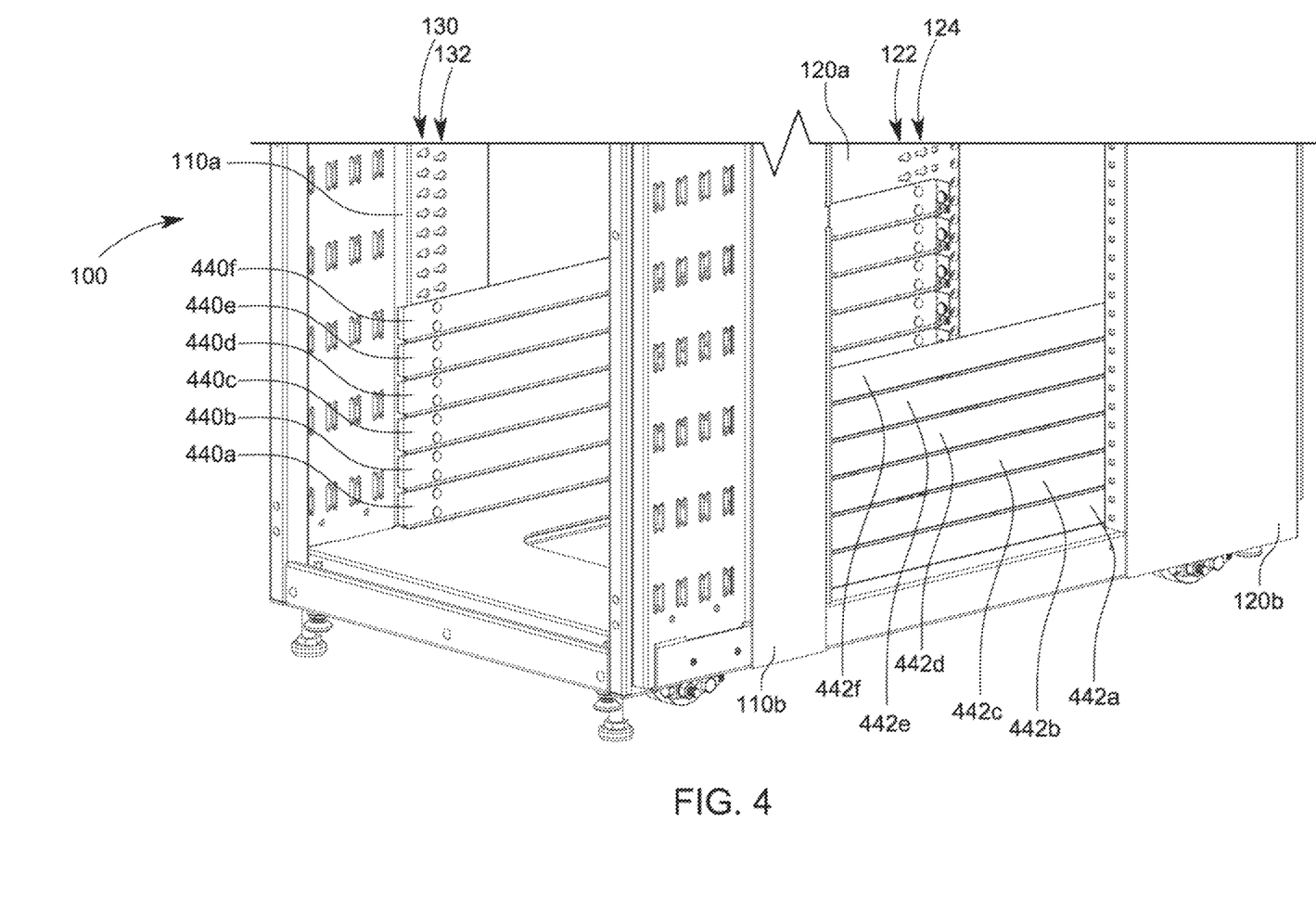
FIG. 4 is a perspective view of a bottom portion of the server rack in FIG. 1 configured for disposing servers of a different uniform height in the server rack, according to some implementations of the present disclosure.

Turning now to FIG. 4, a perspective view of a bottom portion of the server rack 100 in FIG. 1 is depicted configured for holding servers of a different uniform height than the servers in FIG. 2. The exemplary configuration of FIG. 3 is for RU type servers though configurations for other types of servers are contemplated. Furthermore, while more or fewer opposing rails are contemplated, the exemplary aspect of FIG. 4 includes six pairs of opposing rails labeled as 440*a*, 442*a*; 440*b*, 442*b*; and 440*c*, 442*c*; 440*d*, 442*d*; 440*e*, 442*e*; and 440*f*, 442*f*. The six pairs of opposing rails are fastened or otherwise mechanically secured to side walls 10*a*, 10*b*, 120*a*, 120*b*. In some aspects, the side walls may extend for the entire depth of the server rack 100. In other aspects, as illustrated in FIGS. 1 to 3, the side walls are side wall panels with a gap between each side wall panel.

The opposing rails 440*a* to 440*f* may be fastened with screws or pin extensions to holes disposed in a vertical track; or in the side wall itself, in a first column of holes 132 and a second column of holes 124 at side wall panels 110*a*, 120*a*. Opposing rails 442*a* to 442*f* are also similarly fastened to corresponding holes (not shown) at side panels 110*b*, 120*b*. The opposing rails are evenly spaced based on the holes in the first and second columns of holes 132, 124 being evenly spaced to accommodate a sever of a predetermined size and height. As will be discussed later with respect to FIGS. 6 and 7, the same server rack 100 can also be configured to support servers having different sizes and heights by using the columns of holes 130, 122 adjacent to the first and second columns of holes 132, 124.

Figure 5:
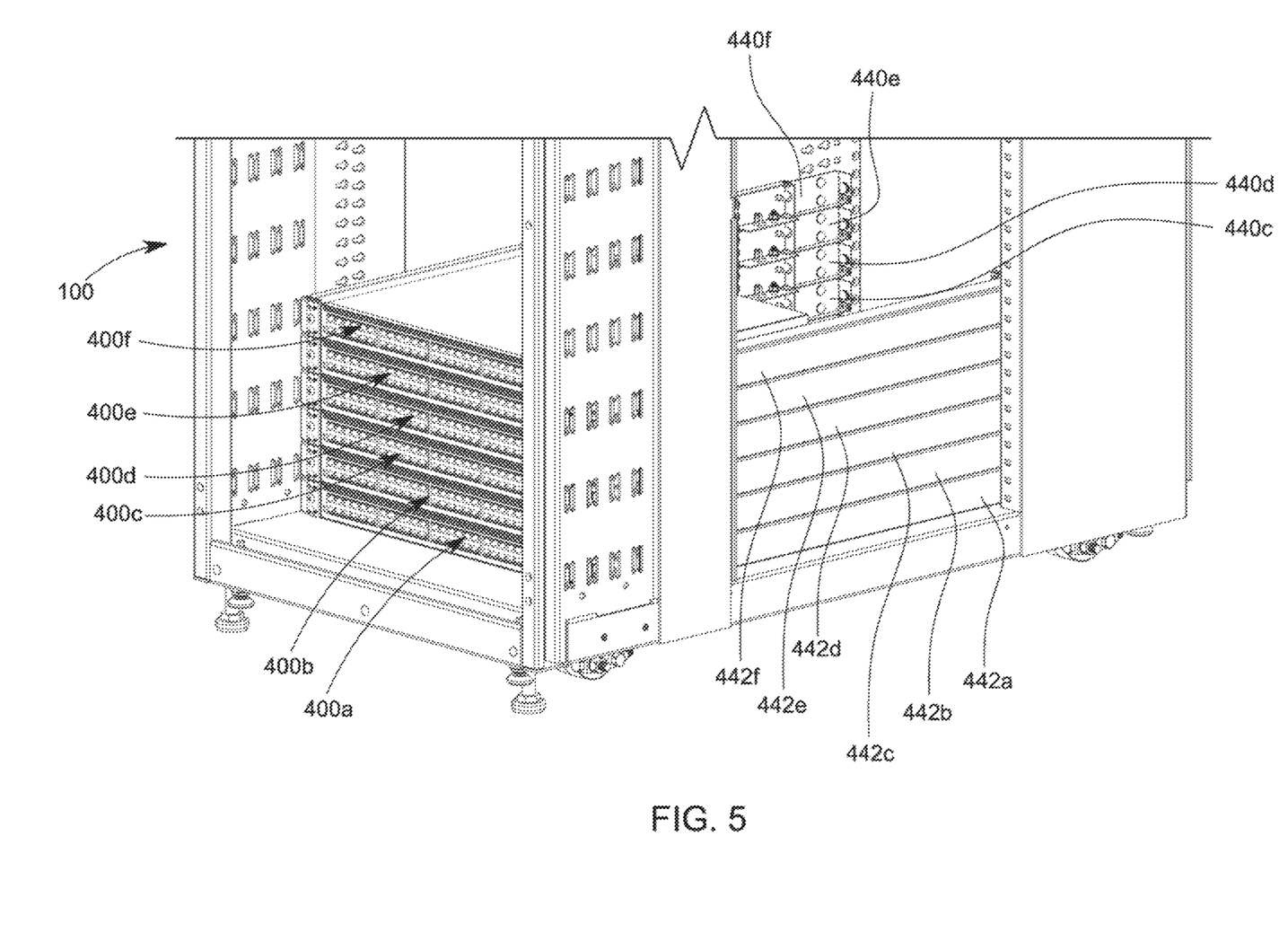
FIG. 5 is a perspective view of the bottom portion of the server rack in FIG. 4 with the servers of a different uniform height disposed in the server rack, according to some implementations of the present disclosure.

Turning now to FIG. 5, a perspective view of the bottom portion of the server rack 100 in FIG. 4 is depicted with the servers 400*a* to 400*f* having a different uniform height and disposed in the server rack 100. The first pair of opposing rails 440*a*, 442*a* support the first server 300*a* of the plurality of servers, where the plurality of servers in this exemplary aspect have a uniform height that is different from the height of servers 300*a* to 300*c* in FIG. 3. Similarly, a second through sixth pair of opposing rails, including rails 440*b*, 442*b*; 440*c*, 440*c*; 440*d*, 442*d*; 440*e*, 442*e*; and 440*f*, 442*f*, respectively supports second through sixth servers 400*b* to 400*f* of the plurality of servers. The rails are configured such that the second through sixth servers 400*b* to 400*f* are disposed immediately above one another, beginning with the second server 400*b* being disposed immediately above first server 400*a*. Additional servers can be similarly added to the server rack 100 until the rack is full.

Figure 6:
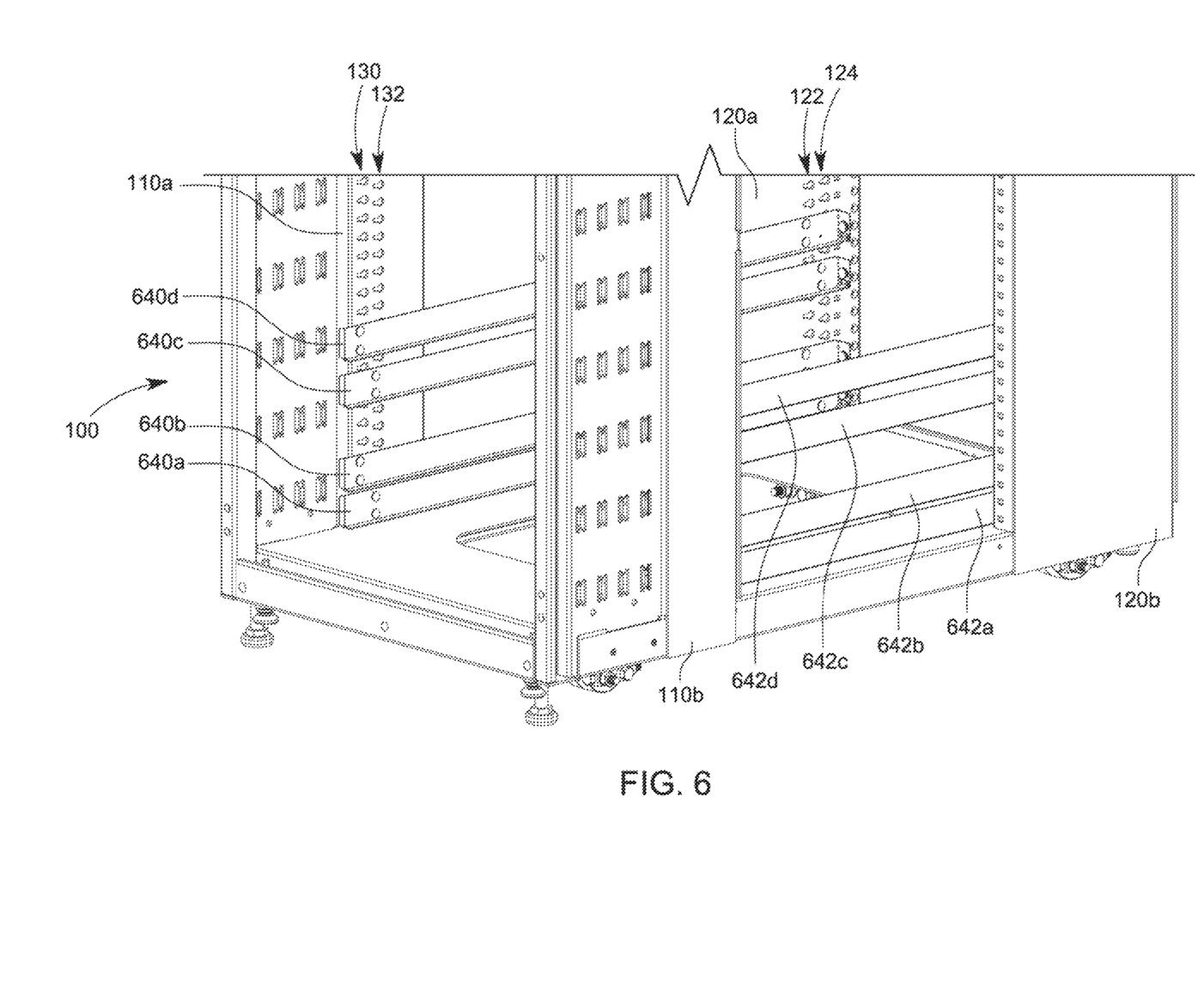
FIG. 6 is a perspective view of a bottom portion of the server rack in FIG. 1 configured for disposing servers of varying heights in the server rack, according to some implementations of the present disclosure.

Turning now to FIG. 6, a perspective view of a bottom portion of the server rack 100 in FIG. 1 is depicted configured for holding servers of varying heights in the server rack 100. The exemplary configuration of FIG. 6 is for a combination of different sized and/or different height servers that are disposed in the same server rack. This combination is described for illustration purposes only in the context of a combination of OU and RU type servers, though configurations for other types of servers are contemplated. Furthermore, while more or fewer opposing rails are contemplated, the exemplary aspect of FIG. 6 includes four pairs of opposing rails labeled as 640*a*, 642*a*; 640*b*, 642*b*; 640*c*, 642*c*; and 640*d*, 642*d*. The four pairs of opposing rails are fastened, or otherwise mechanically secured, to side walls 110*a*, 110*b*, 120*a*, 120*b*. In some aspects, the side walls may extend for the entire depth of the server rack 100. In other aspects, as illustrated in FIG. 6, the side walls are side wall panels with a gap between each side wall panel.

For one type of server, such as the OU server, the opposing rails 640*a*, 640*b*, 640*c*, 640*d* may be fastened with screws or pin extensions to holes disposed in a vertical track or in the side wall itself, in a first column of holes 130 and a second column of holes 122 at side wall panels 110*a*, 120*a*. Opposing rails 142*a*, 142*b*, 142*c* are also similarly fastened to corresponding holes (not shown) at side panels 110*b*, 120*b*. For another type of server, such as the RU server, the opposing rails 640*a*, 640*b*, 640*c*, 640*d* may be fastened with screws or pin extensions to holes disposed in a vertical track or in the side wall itself, in a column of holes 132 and 124 adjacent to the first and second column of holes 130, 122 at side wall panels 110*a*, 120*a*. Opposing rails 642*a*, 642*b*, 642*c*, 642*d* are also similarly fastened to corresponding holes (not shown) at side panels 110*b*, 120*b*. Configurations with more or fewer sets of opposing rails are contemplated and are different configurations or orderings of the different types of servers within the server rack 100

Each set of opposing rails is evenly spaced based on the holes in the first and second columns of holes 130, 122, or the adjacent columns of holes 132, 124, to accommodate a selected server of the desired predetermined size and height. As described below, the same server rack 100 can then be configured to support servers having different sizes and heights.

Figure 7:
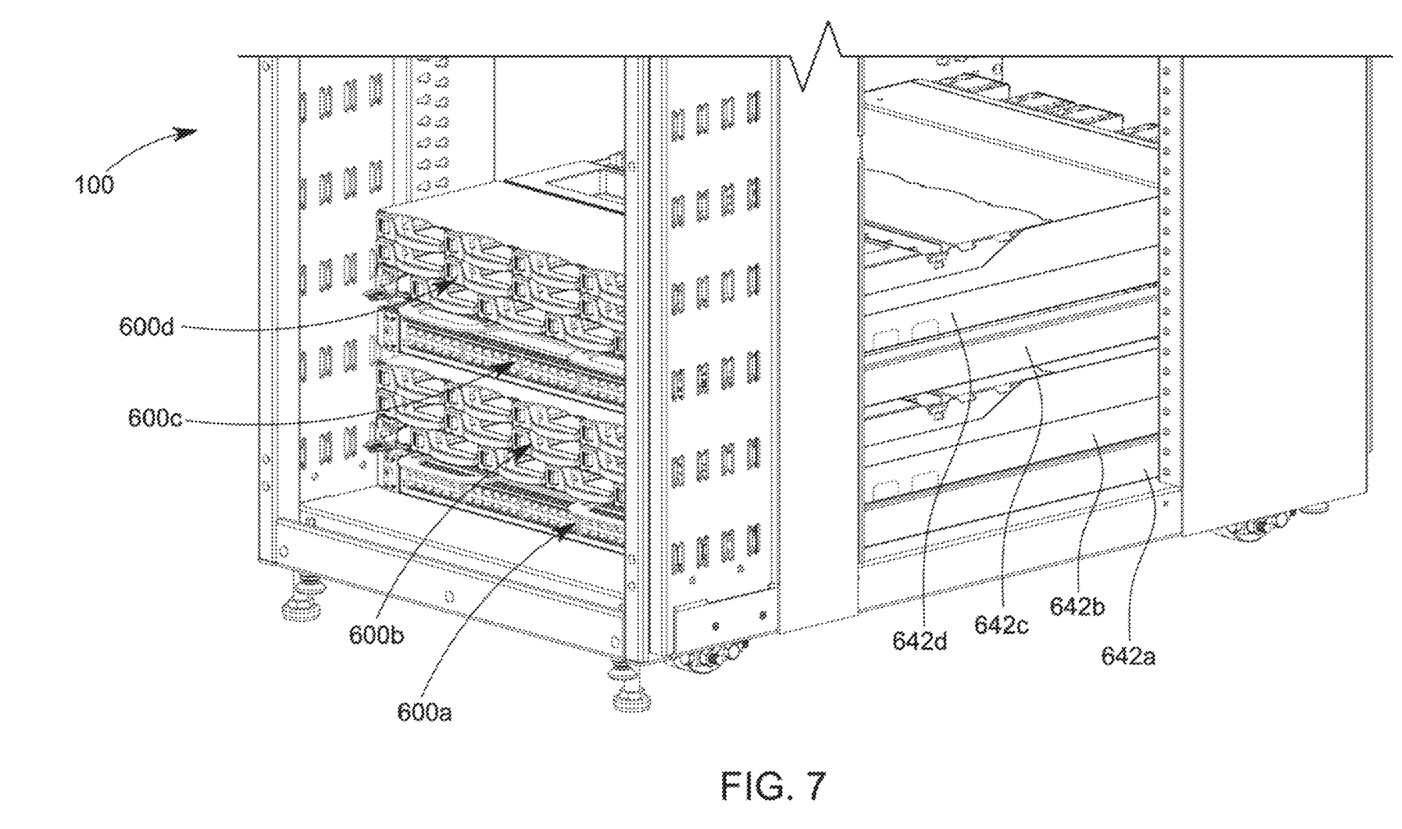
FIG. 7 is a perspective view of the bottom portion of the server rack in FIG. 6 with the servers of varying heights disposed in the server rack, according to some implementations of the present disclosure.

Turning now to FIG. 7, a perspective view of the bottom portion of the server rack 100 in FIG. 6 is depicted with the servers of varying heights disposed in an exemplary stacked order in the server rack. The first pair of opposing rails 640*a*, 642*a* support the first server 600*a* of a plurality of servers. The plurality of servers in this exemplary aspect have varying server heights that are a combination of OU and RU types servers discussed in FIGS. 2 to 5, with server 600*a* being an RU type server. A second pair of opposing rails 640*b*, 642*b* support second server 600*b* of the plurality of servers directly above server 600*a*. Server 600*b* is an OU type server having a different height and size from server 600*a*. A third pair of opposing rails 640*c*, 642*c* support third server 600*c* of the plurality of servers directly above server 600*b*. Server 600*c* is an RU type server having the same height and size as server 600*b*, but different from server 600*b*. A fourth pair of opposing rails 640*d*, 642*d* support fourth server 600*b* of the plurality of servers directly above server 600*c*. Server 600*d* is an OU type server having the same size and height as server 600*b* but a different height and size from servers 600*a* and 600*c*. The rails are configured such that the second through fourth servers 600*b* to 600*d* are disposed immediately above one another, beginning with the second server 600*b* being disposed immediately above first server 600*a*. Additional servers can be similarly added to the server rack 100 until the rack is full.

While various embodiments of the present invention have been described above, it should be understood that they have been presented by way of example only, and not limitation. Numerous changes to the disclosed embodiments can be made in accordance with the disclosure herein without departing from the spirit or scope. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A server rack for supporting a plurality of servers of varying heights, the server rack comprising:
   opposing side walls each including one or more vertical tracks;
   a first column of holes disposed in one of the vertical tracks on one of the side walls and a second column of holes disposed in a corresponding opposing vertical track of an opposing side wall, the holes of the first and second columns of holes being spaced apart according to a Rack Unit pitch such that pairs of holes are spaced 1.75 inches apart;
   a third column of holes disposed in the one of the vertical tracks and a fourth column of holes disposed in the corresponding opposing vertical track of the opposing side wall, the holes of the third and fourth columns of holes being spaced apart according to an OpenU pitch such that pairs of holes are spaced 1.89 inches apart; and
   a first pair of opposing rails disposed on the opposing side walls, each of the first pair of opposing rails mechanically secured to the one or more vertical tracks at the first and second columns of holes, the first pair of opposing rails configured to support a first server of the plurality of servers, the first server having a first height.

2. The server rack of claim 1, wherein the first pair of opposing rails are mechanically secured by one or more pins extending from each rail into one or more holes in the first and second columns of holes disposed in the vertical tracks.

3. The server rack of claim 1, wherein each of the opposing side walls includes two separate side wall panels having a gap therebetween.

4. The server rack of claim 3, wherein each of the two separate side wall panels includes at least one vertical track of the one or more vertical tracks.

5. The server rack of claim 1, further comprising a second pair of opposing rails disposed on the opposing side walls, each of the second pair of opposing rails mechanically secured to the one or more vertical tracks at the third and fourth columns of holes, the second pair of opposing rails configured to support a second server of the plurality of servers, the second server having a second height, different than the first height.

6. The server rack of claim 5, further comprising a third pair of opposing rails disposed on the opposing side walls, each of the third pair of opposing rails mechanically secured to the one or more vertical tracks at the first and second columns of holes, the third pair of opposing rails configured to support a third server of the plurality of servers disposed immediately below the second server, the third server having the first height.

7. The server rack of claim 1, wherein each vertical track of the one or more vertical tracks is fastened to a corresponding side wall of the vertical track.

8. The server rack of claim 1, wherein each vertical track of the one or more vertical tracks is integral with a corresponding side wall of the vertical track.

9. The server rack of claim 1, wherein each of the one or more vertical tracks are parallel to one another.

10. The server rack of claim 1, wherein the first and second columns of holes includes slotted holes.

11. The server rack of claim 10, wherein the slotted holes include at least one keyhole.

12. The server rack of claim 1, wherein the third and fourth columns of holes includes slotted holes.

13. The server rack of claim 12, wherein the slotted holes include at least one keyhole.

14. A method for securing a plurality of servers of varying heights in the same server rack, the method comprising:
   providing a server rack having opposing side walls, each side wall of the opposing side walls including one or more vertical tracks;
   providing a first column of holes disposed in a first vertical of the vertical tracks and a second column of holes disposed in a second vertical track of the vertical tracks opposing the first vertical track, the holes of the first and second columns of holes being spaced apart according to a Rack Unit pitch such that pairs of holes are spaced 1.75 inches apart;
   providing a third column of holes disposed in the first vertical and a fourth column of holes disposed in the second vertical track of the opposing side wall, the holes of the third and fourth columns of holes being spaced apart according to an OpenU pitch such that pairs of holes are spaced 1.89 inches apart;
   securing a first set of opposing rails to the first and second vertical tracks at corresponding first and second columns of holes, the first set of opposing rails configured to support a first server of the plurality of servers.

15. The method of claim 14, wherein the first set of opposing rails are mechanically secured by one or more pins extending from the rail into one or more holes in the first and second columns of holes disposed in the vertical tracks.

16. The method of claim 14, wherein each side wall of the opposing side walls includes two separate side wall panels having a gap therebetween.

17. The method of claim 16, wherein each separate side wall panel of the opposing side walls includes at least one of the first vertical track and at least one of the second vertical track.

18. The server rack of claim 14, further comprising securing a second set of opposing rails to the first and second vertical tracks at corresponding third and fourth columns of holes, the second set of opposing rails configured to support a second server of the plurality of servers, the second server having a second height, different than the first height.

19. The server rack of claim 18, further comprising securing a third set of opposing rails to the first and second vertical tracks at corresponding first and second columns of holes, the third set of opposing rails configured to support the first server of the plurality of servers.

20. The method of claim 14, wherein all the columns of holes disposed in the vertical tracks include slotted holes.

* * * * *